US012598879B2

(12) United States Patent
Lee et al.

(10) Patent No.: US 12,598,879 B2
(45) Date of Patent: Apr. 7, 2026

(54) ORGANIC LIGHT EMITTING DIODE DISPLAY DEVICE AND METHOD OF DRIVING THE SAME

(71) Applicant: LG DISPLAY CO., LTD., Seoul (KR)

(72) Inventors: So-Yi Lee, Paju-si (KR); Da-Hye Shim, Paju-si (KR); Boo-Heung Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 544 days.

(21) Appl. No.: 17/993,212

(22) Filed: Nov. 23, 2022

(65) Prior Publication Data

US 2023/0209931 A1 Jun. 29, 2023

(30) Foreign Application Priority Data

Dec. 29, 2021 (KR) ........................ 10-2021-0190615

(51) Int. Cl.
*H10K 59/131* (2023.01)
*G09G 3/3266* (2016.01)
(Continued)

(52) U.S. Cl.
CPC ......... *H10K 59/131* (2023.02); *G09G 3/3266* (2013.01); *G09G 3/3291* (2013.01);
(Continued)

(58) Field of Classification Search
CPC .. G09G 3/3233; G09G 3/3266; G09G 3/3291; G09G 3/3275; G09G 2330/06; G09G 2300/0819; G09G 2300/0426; G09G 2330/02; G09G 2310/0297; G09G 2310/0262; G09G 2310/061; G09G 2300/0861; H10K 59/1216;
(Continued)

(56) References Cited

U.S. PATENT DOCUMENTS

| 11,107,409 B2 * | 8/2021 | Yang | ..................... G09G 3/3275 |
| 2004/0189585 A1 * | 9/2004 | Moon | .................. G11C 19/184 |
| | | | 345/100 |

(Continued)

FOREIGN PATENT DOCUMENTS

| CN | 210667751 U | 6/2020 |
| KR | 10-2019-0098287 A | 8/2019 |
| KR | 10-2021-0085504 A | 7/2021 |

OTHER PUBLICATIONS

Office Action in Chinese Appln. No. 202211445933.2, mailed on Nov. 27, 2025, 16 pages (with English translation).

*Primary Examiner* — Shaheda A Abdin
(74) *Attorney, Agent, or Firm* — Fish & Richardson P.C.

(57) ABSTRACT

An organic light emitting diode display device includes a plurality of pixels arranged in a matrix of a plurality of rows and a plurality of columns; a gate1 line connected to and supplying a gate1 voltage to the plurality of pixels of each of the plurality of rows; a gate2 line connected to and supplying a gate2 voltage of a present row to the plurality of pixels of a part of the plurality of columns; a gate2 extension line connected to and supplying the gate2 voltage of an adjacent row to the plurality of pixels of another part of the plurality of columns; and left and right data lines disposed in left and right portions of the plurality of pixels of each of the plurality of columns.

10 Claims, 8 Drawing Sheets

(51) Int. Cl.
    *G09G 3/3291*     (2016.01)
    *H10D 86/40*     (2025.01)
    *H10D 86/60*     (2025.01)
    *H10K 59/121*     (2023.01)

(52) U.S. Cl.
    CPC ........... *H10D 86/441* (2025.01); *H10D 86/60*
        (2025.01); *H10K 59/1213* (2023.02); *H10K*
            *59/1216* (2023.02); *G09G 2310/0297*
                        (2013.01)

(58) Field of Classification Search
    CPC ............. H10K 59/1213; H10K 59/131; H10D
                  86/441; H10D 86/60
    See application file for complete search history.

(56) References Cited

U.S. PATENT DOCUMENTS

| | | | | |
|---|---|---|---|---|
| 2007/0057877 A1* | 3/2007 | Choi | .................... | G09G 3/3291 |
| | | | | 345/76 |
| 2009/0243978 A1* | 10/2009 | Yamamoto | ........... | G09G 3/3233 |
| | | | | 345/76 |
| 2018/0277037 A1* | 9/2018 | Lin | ........................ | G06F 3/0412 |
| 2019/0251908 A1* | 8/2019 | Kim | .................... | G09G 3/3275 |

\* cited by examiner

ORGANIC LIGHT EMITTING DIODE DISPLAY DEVICE AND METHOD OF DRIVING THE SAME

CROSS-REFERENCE TO RELATED APPLICATION

The present application claims the priority of Korean Patent Application No. 10-2021-0190615 filed on Dec. 29, 2021, which is hereby incorporated by reference in its entirety.

BACKGROUND

Field of the Disclosure

The present disclosure relates to an organic light emitting diode display device, and more particularly, to an organic light emitting diode display device where a plurality of pixels in one row have different sampling periods and a method of driving the organic light emitting diode display device.

Description of the Background

As an information-oriented society progresses, demand for a display device displaying an image have increased with various forms. In a display device field, a cathode ray tube (CRT) having a relatively large volume has been rapidly replaced by a flat panel display (FPD) device having a thin profile, a light weight and applicable to a relatively large size.

Among the FPD devices, an organic light emitting diode (OLED) display device is an emissive type device and does not include a backlight unit used in a non-emissive type device such as a liquid crystal display (LCD) device. As a result, the OLED display device has advantages in a viewing angle, a contrast ratio and a power consumption to be applied to various fields.

The OLED display device displays an image by supplying a data voltage outputted from a data driving unit to a pixel of a display panel. As a resolution and a driving speed increase, an applying time of the data voltage to each pixel decreases. As a result, a charging time for a data line is reduced.

To solve the above problem, an OLED display device where the data voltage is supplied to one pixel column using two mux transistors and two data lines has been suggested.

In the above OLED display device, since two adjacent pixel rows are driven to be overlapped by one horizontal period (1H), one data line is floated for one horizontal period and the data voltage of the floated data line is distorted due to a variation (ripple) of a high level voltage generated according to a transition of the data voltage of the other data line. Accordingly, deterioration such as a crosstalk occurs.

SUMMARY

Accordingly, the present disclosure is directed to an organic light emitting diode display device and a method of driving the same that substantially obviate one or more of the problems due to limitations and disadvantages described above.

More specifically, the present disclosure is to provide an organic light emitting diode display device where a number of pixels corresponding to a floated data line is reduced and a distortion of a data voltage according to a variation (ripple)

of a high level voltage and a crosstalk are minimized due to a plurality of pixels of one row having different sampling periods and a method of driving the organic light emitting diode display device.

The present disclosure is also to provide an organic light emitting diode display device where a gate driving unit is simplified, a number of pixels corresponding to a floated data line is reduced and a distortion of a data voltage according to a variation (ripple) of a high level voltage and a crosstalk are minimized by disposing a gate2 line and a gate2 extension line in one row and alternately supplying two gate2 voltages to a plurality of pixels of one row and a method of driving the organic light emitting diode display device.

Additional features and aspects will be set forth in the description that follows, and in part will be apparent from the description, or may be learned by practice of the present disclosure provided herein. Other features and aspects of the inventive concepts may be realized and attained by the structure particularly pointed out in the written description, or derivable therefrom, and the claims hereof as well as the appended drawings.

To achieve these and other aspects of the present disclosure, as embodied and broadly described herein, an organic light emitting diode display device includes: a plurality of pixels arranged in a matrix of a plurality of rows and a plurality of columns; a gate 1 line connected to and supplying a gate1 voltage to the plurality of pixels of each of the plurality of rows; a gate2 line connected to and supplying a gate2 voltage of a present row to the plurality of pixels of a part of the plurality of columns; a gate2 extension line connected to and supplying the gate2 voltage of an adjacent row to the plurality of pixels of another part of the plurality of columns; and left and right data lines disposed in left and right portions of the plurality of pixels of each of the plurality of columns.

In another aspect of the present disclosure, a method of driving an organic light emitting diode display device includes initializing a plurality of pixels of a plurality of rows according to a gate1 voltage; sampling the plurality of pixels of a part of a plurality of columns according to a gate2 voltage of a present row; sampling the plurality of pixels of another part of the plurality of columns according to the gate2 voltage of an adjacent row; and emitting the plurality of pixels according to an emission voltage.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the present disclosure and which are incorporated in and constitute a part of this application, illustrate aspects of the disclosure and together with the description serve to explain various principles of the present disclosure.

In the drawings.

DETAILED DESCRIPTION

Reference will now be made in detail to aspects of the disclosure, exemplary aspects of which are illustrated in the accompanying drawings.

Figure 1:
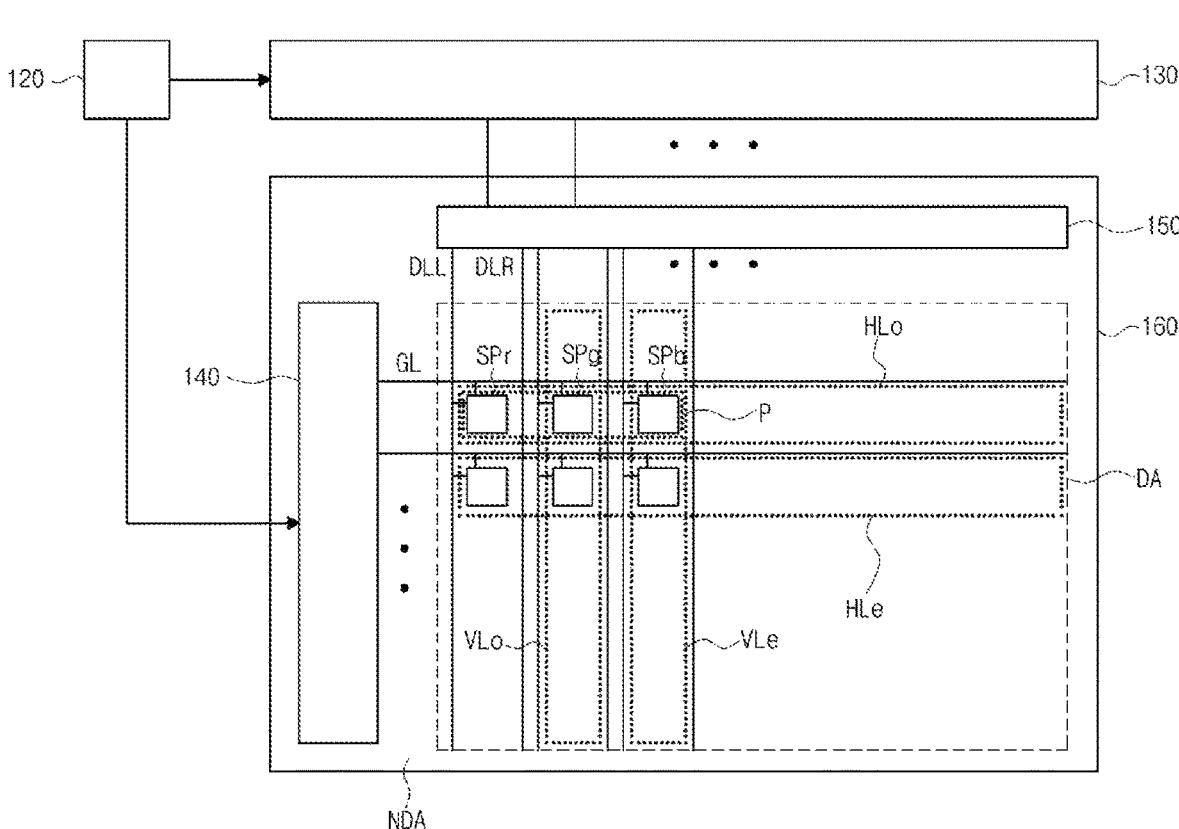
FIG. 1 is a plan view showing an organic light emitting diode display device according to a first aspect of the present disclosure.

FIG. 1 is a plan view showing an organic light emitting diode display device according to a first aspect of the present disclosure.

In FIG. 1, an organic light emitting diode (OLED) display device 110 according to a first aspect of the present disclosure includes a timing controlling unit 120, a data driving unit 130, a gate driving unit 140, a mux unit 150 and a display panel 160.

The timing controlling unit 120 generates an image data, a data control signal and a gate control signal using an image signal and a plurality of timing signals including a data enable signal, a horizontal synchronization signal, a vertical synchronization signal and a clock signal transmitted from an external system such as a graphic card or a television system. The image data and the data control signal are transmitted to the data driving unit 130, and the gate control signal is transmitted to the gate driving unit 140.

The data driving unit 130 generates a data voltage (data signal) using the data control signal and the image data transmitted from the timing controlling unit 120 and transmits the data voltage to the mux unit 150.

The gate driving unit 140 generates a gate voltage (gate signal) using the gate control signal transmitted from the timing controlling unit 120 and applies the gate voltage to a gate line GL of the display panel 160.

The gate driving unit 140 may have a gate in panel (GIP) type to be formed in a non-display area NDA of a substrate of the display panel 160 having the gate line GL, left and right data lines DLL and DLR and a pixel P.

The mux unit 150 selectively applies the data voltage transmitted from the data driving unit 120 to one of the left and right data lines DLL and DLR of the display panel 160.

The mux unit 150 is disposed to correspond to a long side of the display panel 160 and connected to end portions of the left and right data lines DLL and DLR. The mux unit 150 includes first and second mux transistors. The first and second mux transistors may be illustrated in FIG. 2.

The display panel 160 displays an image using the gate voltage and the data voltage. The display panel 160 includes a display area DA displaying an image and a non-display area NDA surrounding the display area DA. The gate driving unit 140 and the mux unit 150 are disposed in the non-display area NDA, and a plurality of pixels P, a plurality of gate lines GL, a plurality of left data lines DLL and a plurality of right data lines DLR are disposed in the display area DA.

Each of the plurality of pixels P includes a plurality of subpixels SP. For example, the plurality of subpixels SP may include red, green and blue subpixels SPr, SPg and SPb.

The gate line GL cross the left data line DLL and the right data line DLR to define the subpixel SP.

The left data line DLL is disposed in a left portion of each subpixel SP and the right data line DLR is disposed in a right portion of each subpixel SP.

For example, the subpixel SP of an odd row (horizontal pixel line) HL-o may be connected to the gate line GL and the left data line DLL, and the subpixel SP of an even row HL-e may be connected to the gate line GL and the right data line DLR.

The mux unit 150 of the OLED display device 110 will be illustrated with reference to a drawing.

Figure 2:
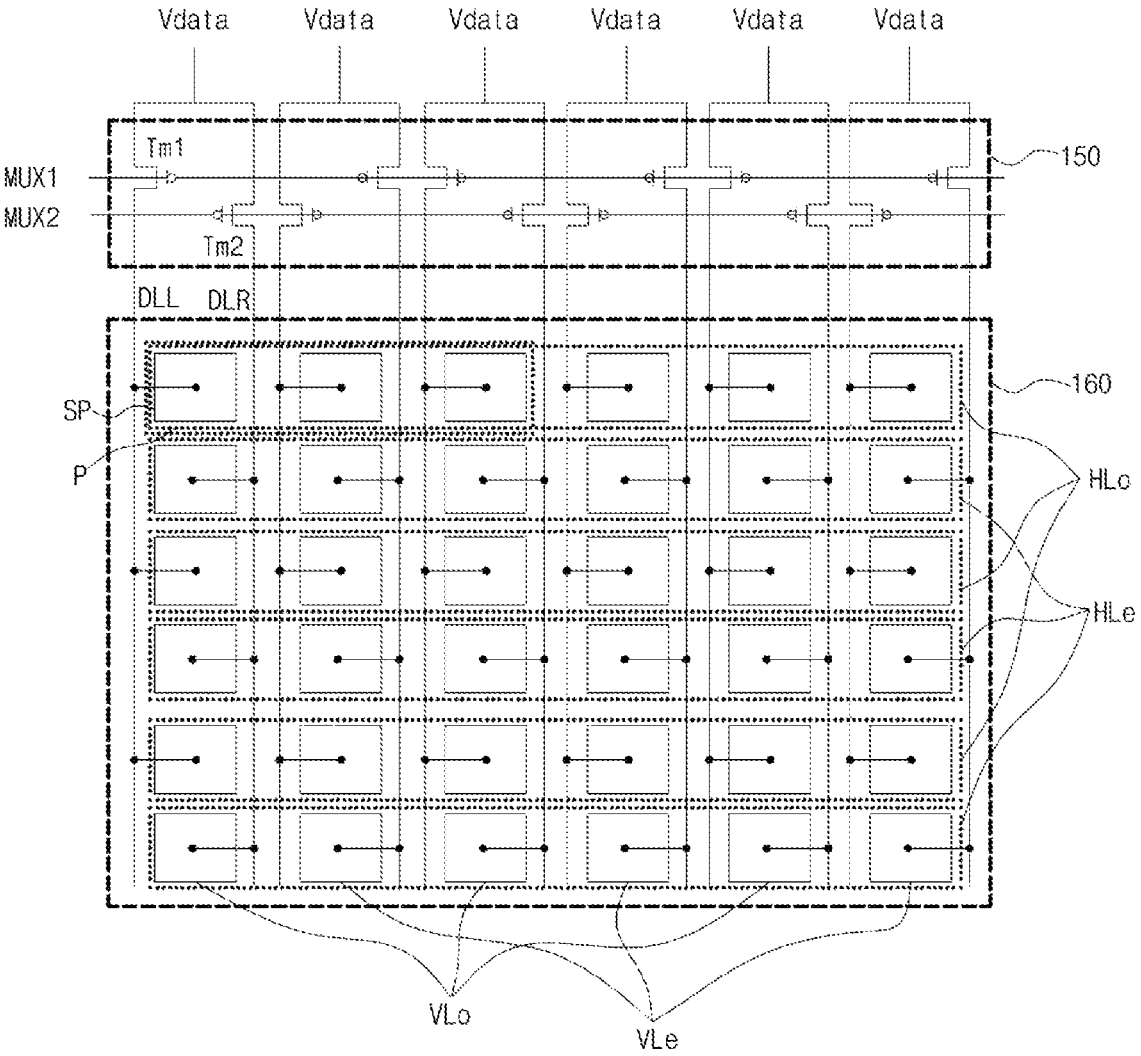
FIG. 2 is a plan view showing a mux unit and a display panel of an organic light emitting diode display device according to a first aspect of the present disclosure.

FIG. 2 is a plan view showing a mux unit and a display panel of an organic light emitting diode display device according to a first aspect of the present disclosure.

In FIG. 2, the mux unit 150 of the OLED display device 110 according to a first aspect of the present disclosure includes first and second mux transistors Tm1 and Tm2. The first and second mux transistors Tm1 and Tm2 may be a positive type transistor.

The first mux transistor Tm1 is switched according to a first mux voltage MUX1 and transmits the data voltage Vdata of the data driving unit 130 to the left data line DLL of an odd column (vertical pixel line) VLo of the display panel 160 and the right data line DLR of an even column VLe of the display panel 160. The second mux transistor Tm2 is switched according to a second mux voltage MUX2 and transmits the data voltage Vdata of the data driving unit 130 to the right data line DLR of an odd column VLo of the display panel 160 and the left data line DLL of an even column VLe of the display panel 160.

For example, the first and second mux voltages MUX1 and MUX2 may include a square wave having opposite polarities and a width of one horizontal period (1H).

During a section of one horizontal period where the first mux transistor Tm1 is turned on and the second mux transistor is turned off, the data voltage Vdata of the data driving unit 130 is supplied to the subpixel SP of the odd row HLo through the left data line DLL of the odd column VLo of the display panel 160 by the mux unit 150 and is supplied to the subpixel SP of the even row HLe through the right data line DLR of the even column VLe of the display panel 160 by the mux unit 150.

During a section of one horizontal period where the first mux transistor Tm1 is turned off and the second mux transistor is turned on, the data voltage Vdata of the data driving unit 130 is supplied to the subpixel SP of the even row HLe through the right data line DLR of the odd column VLo of the display panel 160 by the mux unit 150 and is supplied to the subpixel SP of the odd row HLo through the left data line DLL of the even column VLe of the display panel 160 by the mux unit 150.

The data voltage Vdata is supplied to the subpixel SP of one of the odd row HLo and the even row HLe through one of the left data line DLL and the right data line DLR of each column VLo and VLe during one horizontal period. During one horizontal period where the data voltage Vdata is supplied to the subpixel SP of one of the odd row HLo and the even row HLe through the other one of the left data line DLL and the right data line DLR of each column VLo and VLe, the data voltage Vdata of floated one of the left data line DLL and the right data line DLR is kept. As a result, an applying time of the data voltage Vdata of two horizontal periods is obtained and a charging time of the data voltage Vdata increases.

Figure 3:
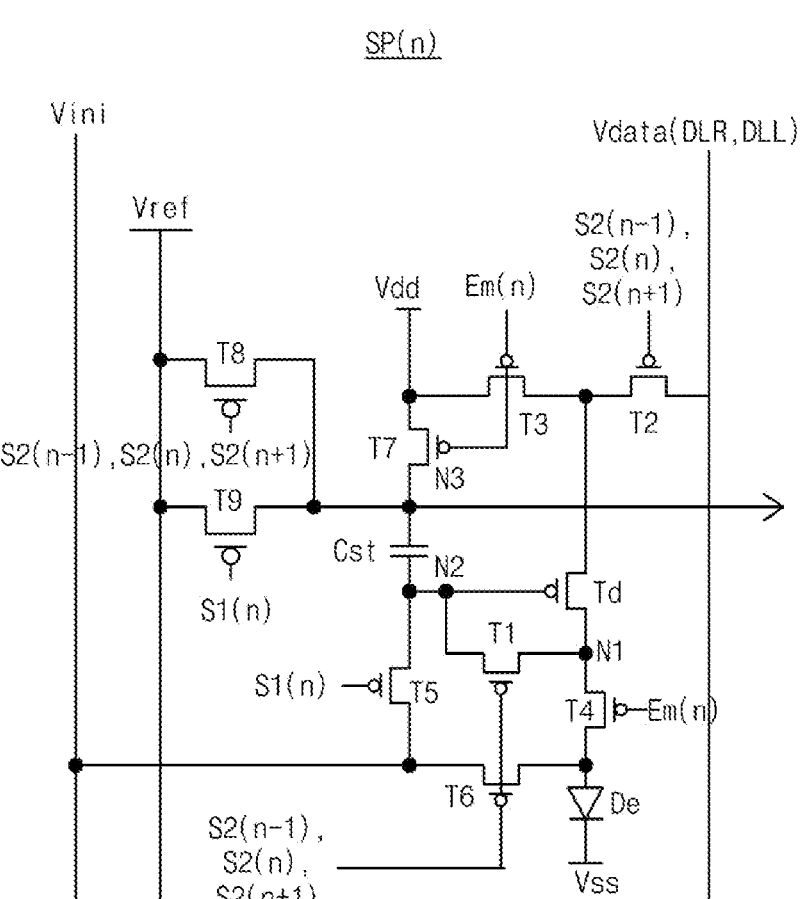
FIG. 3 is a circuit diagram showing a subpixel of an organic light emitting diode display device according to a first aspect of the present disclosure.

FIG. 3 is a circuit diagram showing a subpixel of an organic light emitting diode display device according to a first aspect of the present disclosure.

In FIG. 3, an nth subpixel SP(n) of the display panel 160 of the OLED display device according to a first aspect of the present disclosure includes a driving transistor Td, first to ninth transistors T1 to T9, a storage capacitor Cst and a light emitting diode De, wherein n is a natural number.

For example, the driving transistor Td, the first to ninth transistors T1 to T9 may have a positive type.

The driving transistor Td is switched (turned on and off) according to a voltage of a first electrode of the storage capacitor Cst. A gate electrode of the driving transistor Td is connected to the first electrode of the storage capacitor Cst, a drain electrode of the first transistor T1 and a source electrode of the fifth transistor T5, a source electrode of the driving transistor Td is connected to a drain electrode of the second transistor T2 and a source electrode of the third transistor T3, and a drain electrode of the driving transistor Td is connected to a source electrode of the first transistor T1 and a source electrode of the fourth transistor T4.

The first transistor T1 of a sampling transistor is switched according to one of (n−1)th, nth and (n+1)th gate2 voltages S2(n−1), S2(n) and S2(n+1). A gate electrode of the first transistor T1 is connected to one of the (n−1)th, nth and (n+1)th gate2 voltages S2(n−1), S2(n) and S2(n+1), the source electrode of the first transistor T1 is connected to the drain electrode of the driving transistor Td and a source electrode of the fourth transistor T4, and the drain electrode of the first transistor T1 is connected to the gate electrode of the driving transistor Td, the first electrode of the storage capacitor Cst and a source electrode of the fifth transistor T5.

The second transistor T2 of a switching transistor is switched according to one of the (n−1)th, nth and (n+1)th gate2 voltages S2(n−1), S2(n) and S2(n+1). A gate electrode of the second transistor T2 is connected to one of the (n−1)th, nth and (n+1)th gate2 voltages S2(n−1), S2(n) and S2(n+1), a source electrode of the second transistor T2 is connected to a data voltage Vdata of the left data line DLL or the right data line DLR, and the drain electrode of the second transistor T2 is connected to the source electrode of the driving transistor Td and the source electrode of the third transistor T3.

The third transistor T3 of an emission transistor is switched according to an nth emission voltage Em(n). A gate electrode of the third transistor T3 is connected to the nth emission voltage Em(n), the source electrode of the third transistor T3 is connected to the source electrode of the driving transistor Td and the drain electrode of the second transistor T2, and a drain electrode of the third transistor T3 is connected to a source electrode of the seventh transistor T7 and a high level voltage Vdd.

The fourth transistor T4 of an emission transistor is switched according to the nth emission voltage Em(n). A gate electrode of the fourth transistor T4 is connected to the nth emission voltage Em(n), the source electrode of the fourth transistor T4 is connected to the drain electrode of the driving transistor Td and the source electrode of the first transistor T1, and a drain electrode of the fourth transistor T4 is connected to a source electrode of the sixth transistor T6 and anode of the light emitting diode De.

The fifth transistor T5 is switched according to an nth gate1 voltage S1(n). A gate electrode of the fifth transistor T5 is connected to the nth gate1 voltage S1(n), the source electrode of the fifth transistor T5 is connected to the first electrode of the storage capacitor Cst, the gate electrode of the driving transistor Td and the drain electrode of the first transistor T1, and a drain electrode of the fifth transistor T5 is connected to a drain electrode of the sixth transistor T6 and the initial voltage Vini.

The sixth transistor T6 is switched according to one of the (n−1)th, nth and (n+1)th gate2 voltages S2(n−1), S2(n) and S2(n+1). A gate electrode of the sixth transistor T6 is connected to one of the (n−1)th, nth and (n+1)th gate2 voltages S2(n−1), S2(n) and S2(n+1), the source electrode of the sixth transistor T6 is connected to the drain electrode of the fourth transistor T4 and the anode of the light emitting diode De, and a drain electrode of the sixth transistor T6 is connected to the drain electrode of the fifth transistor T5 and an initial voltage Vini.

The seventh transistor T7 of an emission transistor is switched according to the nth emission voltage Em(n). A gate electrode of the seventh transistor T7 is connected to the nth emission voltage Em(n), the source electrode of the seventh transistor T7 is connected to the drain electrode of the third transistor T3 and the high level voltage Vdd, and a drain electrode of the seventh transistor T7 is connected to a source electrode of the eighth transistor T8, a source electrode of the ninth transistor T9 and a second electrode of the storage capacitor Cst.

The eighth transistor T8 is switched according to one of the (n−1)th, nth and (n+1)th gate2 voltages S2(n−1), S2(n) and S2(n+1). A gate electrode of the eighth transistor T8 is connected to one of the (n−1)th, nth and (n+1)th gate2 voltages S2(n−1), S2(n) and S2(n+1), the source electrode of the eighth transistor T8 is connected to the drain electrode of the seventh transistor T7, the source electrode of the ninth transistor T9 and the second electrode of the storage capacitor Cst, and a drain electrode of the eighth transistor T8 is connected to a drain electrode of the ninth transistor T9 and a reference voltage Vref.

The ninth transistor T9 is switched according to the nth gate 1 voltage S1(n). A gate electrode of the ninth transistor T9 is connected to the nth gate1 voltage S1(n), the source electrode of the ninth transistor T9 is connected to the drain electrode of the seventh transistor T7, the source electrode of the eighth transistor T8 and the second electrode of the storage capacitor Cst, and the drain electrode of the ninth transistor T9 is connected to the drain electrode of the eighth transistor T8 and the reference voltage Vref.

The storage capacitor Cst stores the data voltage Vdata, a threshold voltage Vth and the high level voltage Vdd. The first electrode of the storage capacitor Cst is connected to the gate electrode of the driving transistor Td, the drain electrode of the first transistor T1 and the source electrode of the fifth transistor T5, and the second electrode of the storage capacitor Cst is connected to the drain electrode of the seventh transistor T7, the source electrode of the eighth transistor T8 and the source electrode of the ninth transistor T9.

The light emitting diode De is connected between the fourth and sixth transistors T4 and T6 and a low level voltage Vss and emits a light proportional to a current of the driving transistor Td. The anode of the light emitting diode De is connected to the drain electrode of the fourth transistor T4 and the source electrode of the sixth transistor T6, and the cathode of the light emitting diode De is connected to the low level voltage Vss.

The drain electrode of the driving transistor Td constitutes a first node N1, the gate electrode of the driving transistor Td and the first electrode of the storage capacitor Cst constitute a second node N2, and the second electrode of the storage capacitor Cst constitutes a third node N3.

In the OLED display device 110, the light emitting diode De emits a light according to an operation of the driving transistor Td, the first to ninth transistors T1 to T9 and the storage capacitor Cst to display an image. As a result, a variation of the threshold voltage according to a use time or deterioration of the light emitting diode De is compensated using the subpixel SP, and a luminance is adjusted by driving the light emitting diode De according to a duty ratio corresponding to an emission time.

In the OLED display device 110, the plurality of pixels in one row have different sampling periods by supplying different gate2 voltages to the plurality of pixels in one row.

Figure 4:
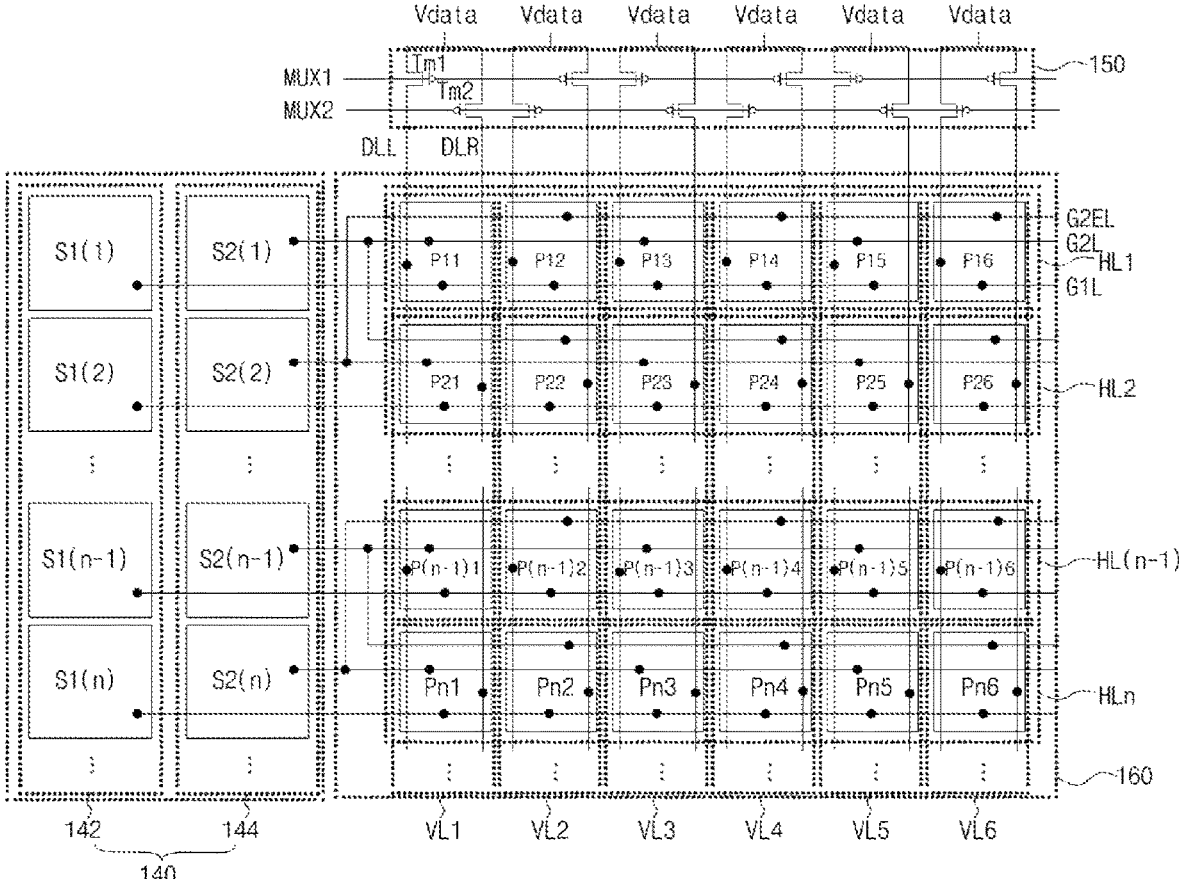
FIG. 4 is a view showing a connection of a pixel and a gate voltage of an organic light emitting diode display device according to a first aspect of the present disclosure.

FIG. 4 is a view showing a connection of a pixel and a gate voltage of an organic light emitting diode display device according to a first aspect of the present disclosure.

In FIG. 4, the OLED display device 110 according to a first aspect of the present disclosure includes the gate driving unit 140, the mux unit 150 and the display panel 160.

The gate driving unit 140 includes a gate1 voltage generating part 142 generating a plurality of gate1 voltages S1 and a gate2 voltage generating part 144 generating a plurality of gate2 voltages S2. Each of the gate1 voltage generating part 142 and the gate2 voltage generating part 144 may include a shift register.

The mux unit 150 includes the first mux transistor Tm1 switched according to the first mux voltage MUX1 to transmit the data voltage Vdata of the data driving unit 130 to one of the left data line DLL and the right data line DLR of the display panel 160 and the second mux transistor Tm2 switched according to the second mux voltage MUX2 to transmit the data voltage Vdata of the data driving unit 130 to the other of the left data line DLL and the right data line DLR of the display panel 160. The first and second mux transistors Tm1 and Tm2 may be a positive type transistor.

The display panel 160 includes the plurality of pixels P. The plurality of pixels P may be disposed in a matrix of a plurality of rows HL parallel to a horizontal direction and a plurality of columns VL parallel to a vertical direction.

For example, the plurality of pixels P may include first-first to second-sixth pixels P11 to P26 and (n−1)th-first to nth-sixth pixels P(n−1)1 to Pn6, and the first-first to second-sixth pixels P11 to P26 and the (n−1)th-first to nth-sixth pixels P(n−1)1 to Pn6 may be classified into first, second, (n−1)th and nth rows HL1, HL2, HL(n−1) and HLn and first to sixth columns VL1 to VL6.

The left and right data lines DLL and DLR are disposed in the left and right portions, respectively, of each subpixel SP, and each subpixel SP is connected to one of the left and right data lines DLL and DLR.

For example, the subpixel SP of odd rows HL1 and HL(n−1) may be connected to the gate line GL and the left data line DLL, and the subpixel SP of even rows HL2 and HLn may be connected to the gate line GL and the right data line DLR.

A gate1 line G1L transmitting the gate1 voltage S1 of a present row, a gate2 line G2L transmitting the gate2 voltage S2 of the present row and a gate2 extension line G2EL transmitting the gate2 voltage S2 of a previous row or a next row are disposed in each of the plurality of rows HL. The gate1 line G1L is connected to the subpixel SP of the pixel P of each column VL of each row HL, the gate2 line G2L is connected to the subpixel SP of the pixel P of the odd columns VLo of each row HL, and the gate2 extension line G2EL is connected to the subpixel SP of the pixel P of the even columns VLe of each row HL.

For example, the gate1 line G1L transmitting the first gate1 voltage S1(1) of the present row, the gate2 line G2L transmitting the first gate2 voltage S2(1) of the present row and the gate2 extension line G2EL transmitting the second gate2 voltage S2(2) of the next row are disposed in the first row HL1, and the gate1 line G1L transmitting the second gate1 voltage S1(2) of the present row, the gate2 line G2L transmitting the second gate2 voltage S2(2) of the present row and the gate2 extension line G2EL transmitting the first gate2 voltage S2(1) of the previous row are disposed in the second row HL2.

The gate1 line G1L transmitting the first gate1 voltage S1(1) of the present row is connected to the subpixels SP of the first-first to first-sixth pixels P11 to P16 of the first row HL1, the gate2 line G2L transmitting the first gate2 voltage S2(1) of the present row is connected to the subpixels SP of the first-first, first-third and first-fifth pixels P11, P13 and P15 of the first row HL1, and the gate2 extension line G2EL transmitting the second gate2 voltage S2(2) of the next row is connected to the subpixels SP of the first-second, first-fourth and first-sixth pixels P12, P14 and P16 of the first row HL1.

The gate1 line G1L transmitting the second gate1 voltage S1(2) of the present row is connected to the subpixels SP of the second-first to second-sixth pixels P21 to P26 of the second row HL2, the gate2 line G2L transmitting the second gate2 voltage S2(2) of the present row is connected to the subpixels SP of the second-first, second-third and second-fifth pixels P21, P23 and P25 of the second row HL2, and the gate2 extension line G2EL transmitting the first gate2 voltage S2(1) of the previous row is connected to the subpixels SP of the second-second, second-fourth and second-sixth pixels P22, P24 and P26 of the second row HL2.

Similarly, the gate1 line G1L transmitting the (n−1)th gate1 voltage S1(n−1) of the present row, the gate2 line G2L transmitting the (n−1)th gate2 voltage S2(n−1) of the present row and the gate2 extension line G2EL transmitting the nth gate2 voltage S2(n) of the next row are disposed in the (n−1)th row HL(n−1), and the gate1 line G1L transmitting the nth gate1 voltage S1(n) of the present row, the gate2 line G2L transmitting the nth gate2 voltage S2(n) of the present row and the gate2 extension line G2EL transmitting the (n−1)th gate2 voltage S2(n−1) of the previous row are disposed in the nth row HLn.

The gate1 line G1L transmitting the (n−1)th gate1 voltage S1(n−1) of the present row is connected to the subpixels SP of the (n−1)th-first to (n−1)th-sixth pixels P(n−1)1 to P(n−1)6 of the (n−1)th row HL(n−1), the gate2 line G2L transmitting the (n−1)th gate2 voltage S2(n−1) of the present row is connected to the subpixels SP of the (n−1)th-first, (n−1)th-third and (n−1)th-fifth pixels P(n−1)1, P(n−1)3 and P(n−1)5 of the (n−1)th row HL(n−1), and the gate2 extension line G2EL transmitting the nth gate2 voltage S2(n) of the next row is connected to the subpixels SP of the (n−1)th-second, (n−1)th-fourth and (n−1)th-sixth pixels P(n−1)2, P(n−1)4 and P(n−1)6 of the (n−1)th-fourth and (n−1)th-sixth pixels P(n−1)2, P(n−1)4 and P(n−1)6 of the n−1)th row HL(n−1).

The gate1 line G1L transmitting the nth gate1 voltage S1(n) of the present row is connected to the subpixels SP of the nth-first to nth-sixth pixels Pn1 to Pn6 of the nth row HLn, the gate2 line G2L transmitting the nth gate2 voltage S2($n$) of the present row is connected to the subpixels SP of the nth-first, nth-third and nth-fifth pixels Pn1, Pn3 and Pn5 of the nth row HLn, and the gate2 extension line G2EL transmitting the (n−1)th gate2 voltage S2($n$−1) of the previous row is connected to the subpixels SP of the nth-second, nth-fourth and nth-sixth pixels Pn2, Pn4 and Pn6 of the nth row HLn.

As a result, the gate1 voltage S1 of the present row is supplied to the subpixel SP of the plurality of pixels P in each of the plurality of rows HL to perform an initialization period. Further, the gate2 voltage S2 of the present row is supplied to the subpixel SP of the pixel P in an odd column VLo of each of the plurality of rows HL to perform a sampling period, and the gate2 voltage S2 of the previous row or the next row is supplied to the subpixel SP of the pixel P in an even column VLe of each of the plurality of rows HL to perform the sampling period.

Since the gate2 voltages S2 of different rows have different timings (e.g., difference of one horizontal period (1H)), the sampling periods are performed during different sections in the subpixels SP of the pixel P of the odd column VLo and the even column VLe of each of the plurality of rows HL. As a result, a coupling of the data line DLL and DLR and the power line is reduced to a half, a variation (ripple) of a high level voltage Vdd of the power line due to the coupling is reduced, and a distortion of the data voltage Vdata due to the variation is reduced.

Detailed operation of the subpixel of the OLED display device 110 will be illustrated with reference to a drawing.

Figure 5:
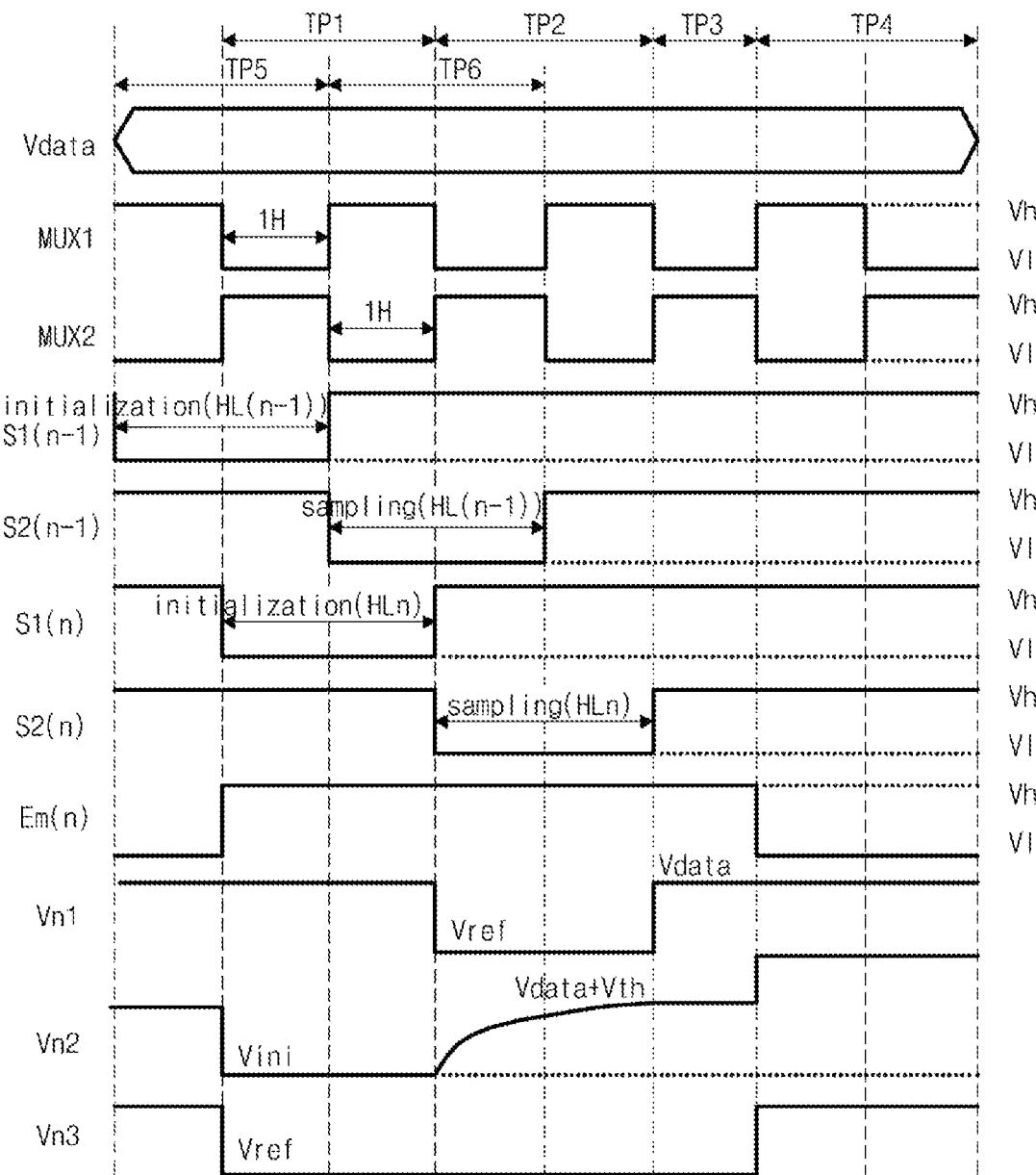
FIG. 5 is a view showing a plurality of signals used in a subpixel of an organic light emitting diode display device according to a first aspect of the present disclosure.

FIG. 5 is a view showing a plurality of signals used in a subpixel of an organic light emitting diode display device according to a first aspect of the present disclosure.

After the operation of the nth subpixel SP(n) of the pixel P of the odd column VLo of the nth row HLn is illustrated, the operation of the nth subpixel SP(n) of the pixel P of the even column VLe of the nth row HLn is illustrated.

In FIG. 5, a frame for displaying an image includes first to fourth time periods TP1 to TP4. Each of the first and second time periods TP1 and TP2 may be twice (2H) of one horizontal period 1H where the data voltage Vdata is applied to one row HL of the display panel 160.

During the first time period TP1 of an initialization period of the nth subpixel SP(n) of the pixel P of the odd column VLo of the nth row HLn, the first mux voltage MUX1 has a low logic voltage V1 and a high logic voltage Vh sequentially, and the second mux voltage MUX2 has the high logic voltage Vh and the low logic voltage V1 sequentially. The nth gate1 voltage S1($n$) has the low logic voltage V1, and the nth gate2 voltage S2($n$) and the nth emission voltage Em(n) have the high logic voltage Vh.

As a result, during the first time period TP1, the first mux transistor Tm1 is sequentially turned on and off, and the second mux transistor Tm2 is sequentially turned off and on. The fifth and ninth transistors T5 and T9 of the nth subpixel SP(n) of the odd column VLo are turned on, and the first, second, third, fourth, sixth, seventh and eighth transistors T1, T2, T3, T4, T6, T7 and T8 of the nth subpixel SP(n) of the odd column VLo are turned off. A second node voltage Vn2 of the second node N2 becomes the initial voltage Vini, and a third node voltage Vn3 of the third node N3 becomes the reference voltage Vref.

During the second time period TP2 of a sampling period of the nth subpixel SP(n) of the pixel P of the odd column VLo of the nth row HLn, the first mux voltage MUX1 has the low logic voltage V1 and the high logic voltage Vh sequentially, and the second mux voltage MUX2 has the high logic voltage Vh and the low logic voltage V1 sequentially. The nth gate1 voltage S1($n$) and the nth emission voltage Em(n) have the high logic voltage Vh, and the nth gate2 voltage S2($n$) has the low logic voltage V1.

As a result, during the second time period TP2, the first mux transistor Tm1 is sequentially turned on and off, and the second mux transistor Tm2 is sequentially turned off and on. The first, second, sixth and eighth transistors T1, T2, T6 and T8 of the nth subpixel SP(n) of the odd column VLo are turned on, and the third, fourth, fifth, seventh and ninth transistors T3, T4, T5, T7 and T9 of the nth subpixel SP(n) of the odd column VLo are turned off. A first node voltage Vn1 of the first node N1 becomes the data voltage Vdata, the second node voltage Vn2 of the second node N2 becomes a sum (Vdata+Vth) of the data voltage Vdata and the threshold voltage Vth, and the third node voltage Vn3 of the third node N3 is maintained as the reference voltage Vref.

During the third time period TP3 of a holding period of the nth subpixel SP(n) of the pixel P of the odd column VLo of the nth row HLn, the first mux voltage MUX1 has the low logic voltage V1, and the second mux voltage MUX2 has the high logic voltage Vh. The nth gate1 voltage S1($n$), the nth gate2 voltage S2($n$) and the nth emission voltage Em(n) have the high logic voltage Vh.

As a result, during the third time period TP3, the first mux transistor Tm1 is turned on, and the second mux transistor Tm2 is turned off. The first, second, third, fourth, fifth, sixth, seventh, eighth and ninth transistors T1, T2, T3, T4, T5, T6, T7, T8 and T9 of the nth subpixel SP(n) of the odd column VLo are turned off. The first node voltage Vn1 of the first node N1 is maintained as the data voltage Vdata, the second node voltage Vn2 of the second node N2 is maintained as the sum (Vdata+Vth) of the data voltage Vdata and the threshold voltage Vth, and the third node voltage Vn3 of the third node N3 is maintained as the reference voltage Vref.

During the fourth time period TP4 of an emission period of the nth subpixel SP(n) of the pixel P of the odd column VLo of the nth row HLn, the first mux voltage MUX1 has the high logic voltage Vh and the low logic voltage V1 sequentially, and the second mux voltage MUX2 has the low logic voltage V1 and the high logic voltage Vh sequentially. The nth gate1 voltage S1($n$) and the nth gate2 voltage S2($n$) have the high logic voltage Vh, and the nth emission voltage Em(n) has the low logic voltage V1.

As a result, during the fourth time period TP4, the third, fourth and seventh transistors T3, T4 and T7 are turned on, and the first, second, fifth, sixth, eighth and ninth transistors T1, T2, T5, T6, T8 and T9 of the nth subpixel SP(n) of the odd column VLo are turned off. The first node voltage Vn1 of the first node N1 becomes the high level voltage Vdd, the second node voltage Vn2 of the second node N2 becomes a value (Vdd−Vref+Vdata+Vth) obtained by adding a difference (Vdd−Vref) between the high level voltage Vdd and the reference voltage Vref to the sum (Vdata+Vth) of the data voltage Vdata and the threshold voltage Vth.

Since a current proportional to a square of a value (−Vref+Vdata) obtained by subtracting the threshold voltage Vth from a gate-source voltage (Vgs=(Vg−Vs)=(Vdd−Vref+Vdata+Vth)−Vdd=Vdata−Vref+Vth) flows in the driving transistor Td, variations of the high level voltage Vdd and the threshold voltage Vth are compensated.

During the first time period TP1 of the initialization period of the nth row HLn, the subpixel SP of the odd column VLo and the even column VLe initializes the first and second electrodes of the storage capacitor Cst as the initial voltage Vini and the reference voltage Vref, respectively.

During the second time period TP2 of the sampling period of the nth row HLn, the subpixel SP of the odd column VLo stores the data voltage Vdata and the threshold voltage Vth of the driving transistor Td in the storage capacitor Cst according to the nth gate2 voltage S2(*n*).

During the sixth time period TP6 of the sampling period of the (n−1)th row HL(n−1) different from the second time period TP2, the subpixel SP of the even column VLe stores the data voltage Vdata and the threshold voltage Vth of the driving transistor Td in the storage capacitor Cst according to the (n−1)th gate2 voltage S2(*n*−1).

The left and right data lines DLL and DLR of all the subpixels SP of the odd and even pixels P of the nth row HLn are not simultaneously charged with the data voltage Vdata. Instead, the left and right data lines DLL and DLR of the subpixel SP of the odd pixel P and the left and right data lines DLL and DLR of the subpixel SP of the even pixel P are charged with the data voltage Vdata during different time periods. As a result, a coupling of the left and right data lines DLL and DLR and the power line is reduced, a variation (ripple) of the high level voltage Vdd of the power line due to the coupling is reduced, and a distortion of the data voltage Vdata due to the variation is reduced.

During the fifth time period TP5 of the initialization period of the (n−1)th row HL(n−1), the subpixel SP of the odd column VLo and the even column VLe initializes the first and second electrodes of the storage capacitor Cst as the initial voltage Vini and the reference voltage Vref, respectively.

During the sixth time period TP6 of the sampling period of the (n−1)th row HL(n−1), the subpixel SP of the odd column VLo stores the data voltage Vdata and the threshold voltage Vth of the driving transistor Td in the storage capacitor Cst according to the (n−1)th gate2 voltage S2(*n*−1).

During the second time period TP2 of the sampling period of the nth row HLn different from the sixth time period TP6, the subpixel SP of the even column VLe stores the data voltage Vdata and the threshold voltage Vth of the driving transistor Td in the storage capacitor Cst according to the nth gate2 voltage S2(*n*).

The left and right data lines DLL and DLR of all the subpixels SP of the odd and even pixels P of the (n−1)th row HL(n−1) are not simultaneously charged with the data voltage Vdata. Instead, the left and right data lines DLL and DLR of the subpixel SP of the odd pixel P and the left and right data lines DLL and DLR of the subpixel SP of the even pixel P are charged with the data voltage Vdata during different time periods. As a result, a coupling of the left and right data lines DLL and DLR and the power line is reduced, a variation (ripple) of the high level voltage Vdd of the power line due to the coupling is reduced, and a distortion of the data voltage Vdata due to the variation is reduced.

The fifth time period TP5 has a width of two horizontal periods (2H) and precedes the first time period TP1 by one horizontal period (1H). The sixth time period TP6 has a width of two horizontal periods (2H) and precedes the second time period TP2 by one horizontal period (1H).

Reduction of the variation of the high level voltage Vdd in the OLED display device 110 will be illustrated with reference to drawings.

Figure 6A:
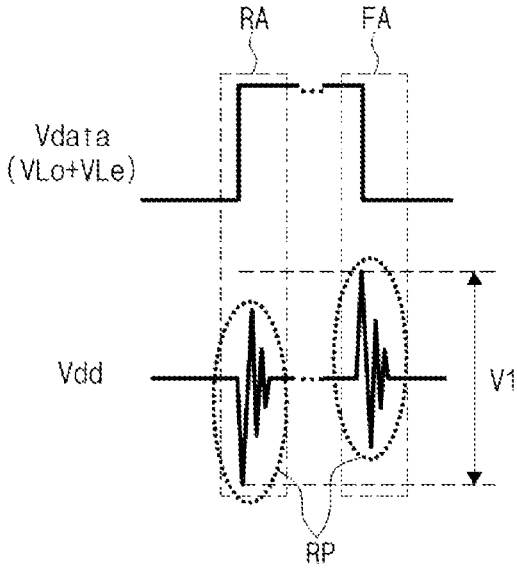
FIG. 6A is a view showing a variation of a high level voltage of an organic light emitting diode display device according to a comparison example.
Figure 6B:
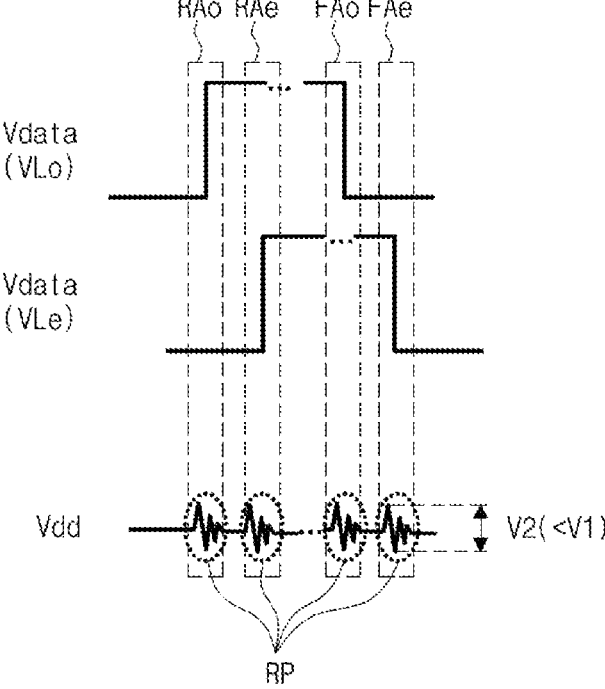
FIG. 6B is a view showing a variation of a high level voltage of an organic light emitting diode display device according to a first aspect of the present disclosure.

FIG. 6A is a view showing a variation of a high level voltage of an organic light emitting diode display device according to a comparison example and FIG. 6B is a view showing a variation of a high level voltage of an organic light emitting diode display device according to a first aspect of the present disclosure.

In an organic light emitting diode display device according to a comparison example of FIG. 6A where sampling periods are not divided by a column VL, during a sampling period where a data voltage Vdata supplied to odd and even columns VLo and VLe of a next row HL transitions from a low level to a high level in a rising area RA and transitions from a high level to a low level in a falling area FA, a variation RP of a first voltage V1 occurs in a high level voltage Vdd of a power line due to a coupling of left and right data lines DLL and DLR and the power line in the next row HL, and a distortion occurs in the floated data voltage Vdata of the left and right data lines DLL and DLR of a present row HL due to the variation RP of the high level voltage Vdd.

In the OLED display device 110 according to a first aspect of the present disclosure of FIG. 6B, during the sampling period where the data voltage Vdata supplied to the odd column VLo of the next row HL transitions from a low level to a high level in an odd rising area RAo and transitions from a high level to a low level in an odd falling area FAo and during the other sampling period where the data voltage Vdata supplied to the even column VLe of the next row HL transitions from a low level to a high level in an even rising area RAe and transitions from a high level to a low level in an even falling area FAe, a variation RP occurs in the high level voltage Vdd of the power line due to a coupling of the left and right data lines DLL and DLR and the power line in the next row HL, and a distortion occurs in the floated data voltage Vdata of the left and right data lines DLL and DLR of the present row HL due to the variation RP of the high level voltage Vdd.

Since the columns VL relating to the coupling are divided into odd and even ones such that the number of the columns VL relating to the coupling is reduced to a half, the variation RP of the high level voltage Vdd of the OLED display device 110 according to a first aspect of the present disclosure has a second voltage V2 smaller than the first voltage V1. (V2<V1)

As a result, the distortion of the data voltage Vdata of the present row HL due to the second voltage V2 of the variation RP of the high level voltage Vdd of a first aspect is reduced as compared with the first voltage V1 of the variation RP of the high level voltage Vdd of a comparison example.

In the OLED display device 110 according to a first aspect of the present disclosure, the gate2 line G2L and the gate2 extension line G2EL are connected to the odd column VLo and the even column VLe, respectively, and the odd column VLo and the even column VLe are driven according to the gate2 voltage S2 of the present row and the gate2 voltage S2 of the adjacent row (previous row or next row) to have different sampling periods. As a result, the variation (ripple) of the high level voltage Vdd is reduced and the distortion of the data voltage Vdata is minimized such that deterioration such as a crosstalk is reduced.

Further, since the sampling period of the present row is driven using the gate2 voltage of the previous row or the next row without an additional signal, an additional gate driving unit for generating the additional signal is not required. As a result, the gate driving unit is simplified and a fabrication cost is reduced.

The columns of pixel may be divided into an odd pair and an even pair in another aspect.

Figure 7:
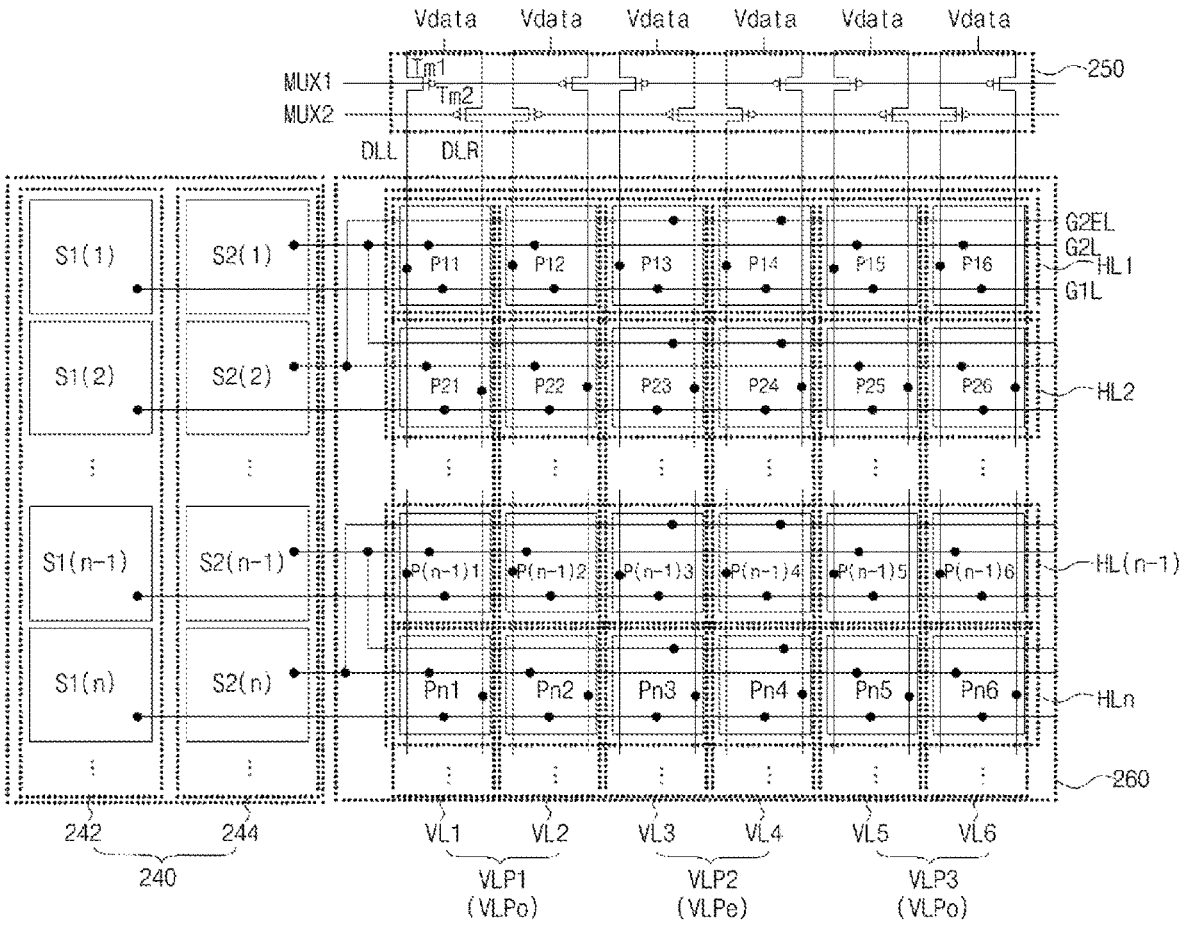
FIG. 7 is a view showing a connection of a pixel and a gate voltage of an organic light emitting diode display device according to a second aspect of the present disclosure.

FIG. 7 is a view showing a connection of a pixel and a gate voltage of an organic light emitting diode display device according to a second aspect of the present disclosure. Illustration on a part the same as that of a first aspect may be omitted.

In FIG. 7, an organic light emitting diode (OLED) display device according to a second aspect of the present disclosure includes a gate driving unit 240, a mux unit 250 and a display panel 260.

The gate driving unit 240 includes a gate1 voltage generating part 242 generating a plurality of gate1 voltages S1 and a gate2 voltage generating part 244 generating a plurality of gate2 voltages S2. Each of the gate1 voltage generating part 242 and the gate2 voltage generating part 244 may include a shift register.

The mux unit 250 includes a first mux transistor Tm1 switched according to a first mux voltage MUX1 to transmit a data voltage Vdata of the data driving unit to one of a left data line DLL and a right data line DLR of the display panel 260 and a second mux transistor Tm2 switched according to a second mux voltage MUX2 to transmit the data voltage Vdata of the data driving unit to the other of the left data line DLL and the right data line DLR of the display panel 260. The first and second mux transistors Tm1 and Tm2 may be a positive type transistor.

The display panel 260 includes the plurality of pixels P. The plurality of pixels P may be disposed in a matrix of a plurality of rows HL parallel to a horizontal direction and a plurality of columns VL parallel to a vertical direction. The plurality of columns VL may be classified into a plurality of column pairs VLP.

For example, the plurality of pixels P may include first-first to second-sixth pixels P11 to P26 and (n−1)th-first to nth-sixth pixels P(n−1)1 to Pn6, and the first-first to second-sixth pixels P11 to P26 and the (n−1)th-first to nth-sixth pixels P(n−1)1 to Pn6 may be classified into first, second, (n−1)th and nth rows HL1, HL2, HL(n−1) and HLn and first to sixth columns VL1 to VL6.

The left and right data lines DLL and DLR are disposed in left and right portions, respectively, of each subpixel SP, and each subpixel SP is connected to one of the left and right data lines DLL and DLR.

For example, the subpixel SP of odd rows HL1 and HL(n−1) may be connected to the gate line GL and the left data line DLL, and the subpixel SP of even rows HL2 and HLn may be connected to the gate line GL and the right data line DLR.

A gate1 line G1L transmitting a gate1 voltage S1 of a present row, a gate2 line G2L transmitting a gate2 voltage S2 of the present row and a gate2 extension line G2EL transmitting the gate2 voltage S2 of a previous row or a next row are disposed in each of the plurality of rows HL. The gate1 line G1L is connected to the subpixel SP of the pixel P of each column VL of each row HL, the gate2 line G2L is connected to the subpixel SP of the pixel P of the odd column pairs VLPo of each row HL, and the gate2 extension line G2EL is connected to the subpixel SP of the pixel P of the even column pairs VLPe of each row HL.

For example, the gate1 line G1L transmitting the first gate1 voltage S1(1) of the present row, the gate2 line G2L transmitting the first gate2 voltage S2(1) of the present row and the gate2 extension line G2EL transmitting the second gate2 voltage S2(2) of the next row are disposed in the first row HL1, and the gate1 line G1L transmitting the second gate1 voltage S1(2) of the present row, the gate2 line G2L transmitting the second gate2 voltage S2(2) of the present row and the gate2 extension line G2EL transmitting the first gate2 voltage S2(1) of the previous row are disposed in the second row HL2.

The gate 1 line G1L transmitting the first gate1 voltage S1(1) of the present row is connected to the subpixels SP of the first-first to first-sixth pixels P11 to P16 of the first to sixth columns VL1 to VL6 of the first to third column pairs VLP1 to VLP3 of the first row HL1, the gate2 line G2L transmitting the first gate2 voltage S2(1) of the present row is connected to the subpixels SP of the first-first, first-second, first-fifth and first-sixth pixels P11, P12, P15 and P16 of the first, second, fifth and sixth columns VL1, VL2, VL5 and VL6 of the first and third column pairs VLP1 and VLP3 of the first row HL1, and the gate2 extension line G2EL transmitting the second gate2 voltage S2(2) of the next row is connected to the subpixels SP of the first-third and first-fourth pixels P13 and P14 of the third and fourth columns VL3 and VL4 of the second column pair VLP2 of the first row HL1.

The gate1 line G1L transmitting the second gate1 voltage S1(2) of the present row is connected to the subpixels SP of the second-first to second-sixth pixels P21 to P26 of the first to sixth columns VL1 to VL6 of the first to third column pairs VLP1 to VLP3 of the second row HL2, the gate2 line G2L transmitting the second gate2 voltage S2(2) of the present row is connected to the subpixels SP of the second-first, second-second, second-fifth and second-sixth pixels P21, P22, P25 and P26 of the first, second, fifth and sixth columns VL1, VL2, VL5 and VL6 of the first and third column pairs VLP1 and VLP3 of the second row HL2, and the gate2 extension line G2EL transmitting the first gate2 voltage S2(1) of the previous row is connected to the subpixels SP of the second-third and second-fourth pixels P23 and P24 of the third and fourth columns VL3 and VL4 of the second column pair VLP2 of the second row HL2.

Similarly, the gate1 line G1L transmitting the (n−1)th gate1 voltage S1(n−1) of the present row, the gate2 line G2L transmitting the (n−1)th gate2 voltage S2(n−1) of the present row and the gate2 extension line G2EL transmitting the nth gate2 voltage S2(n) of the next row are disposed in the (n−1)th row HL(n−1), and the gate1 line G1L transmitting the nth gate1 voltage S1(n) of the present row, the gate2 line G2L transmitting the nth gate2 voltage S2(n) of the present row and the gate2 extension line G2EL transmitting the (n−1)th gate2 voltage S2(n−1) of the previous row are disposed in the nth row HLn.

The gate1 line G1L transmitting the (n−1)th gate1 voltage S1(n−1) of the present row is connected to the subpixels SP of the (n−1)th-first to (n−1)th-sixth pixels P(n−1)1 to P(n−1)6 of the first to sixth columns VL1 to VL6 of the first to third column pairs VLP1 to VLP3 of the (n−1)th row HL(n−1), the gate2 line G2L transmitting the (n−1)th gate2 voltage S2(n−1) of the present row is connected to the subpixels SP of the (n−1)th-first, (n−1)th-second, (n−1)th-fifth and (n−1)th-sixth pixels P(n−1)1, P(n−1)2, P(n−1)5 and P(n−1)6 of the first, second, fifth and sixth columns VL1, VL2, VL5 and VL6 of the first and third column pairs VLP1 and VLP3 of the (n−1)th row HL(n−1), and the gate2 extension line G2EL transmitting the nth gate2 voltage S2(n) of the next row is connected to the subpixels SP of the (n−1)th-third and (n−1)th-fourth pixels P(n−1)3 and P(n−1)4 of the third and fourth columns VL3 and VL4 of the second column pair VLP2 of the (n−1)th row HL(n−1).

The gate1 line G1L transmitting the nth gate1 voltage S1(n) of the present row is connected to the subpixels SP of the nth-first to nth-sixth pixels Pn1 to Pn6 of the first to sixth columns VL1 to VL6 of the first to third column pairs VLP1 to VLP3 of the nth row HLn, the gate2 line G2L transmitting the nth gate2 voltage S2(n) of the present row is connected to the subpixels SP of the nth-first, nth-second, nth-fifth and nth-sixth pixels Pn1, Pn2, Pn5 and Pn6 of the first, second, fifth and sixth columns VL1, VL2, VL5 and VL6 of the first and third column pairs VLP1 and VLP3 of the nth row HLn, and the gate2 extension line G2EL transmitting the (n−1)th gate2 voltage S2($n$−1) of the previous row is connected to the subpixels SP of the nth-third and nth-fourth pixels Pn3 and Pn4 of the third and fourth columns VL3 and VL4 of the second column pair VLP2 of the nth row HLn.

As a result, the gate1 voltage S1 of the present row is supplied to the subpixel SP of the plurality of pixels P in each of the plurality of rows HL to perform an initialization period. Further, the gate2 voltage S2 of the present row is supplied to the subpixel SP of the pixel P in an odd column pair VLPo of each of the plurality of rows HL to perform a sampling period, and the gate2 voltage S2 of the previous row or the next row is supplied to the subpixel SP of the pixel P in an even column pair VLPe of each of the plurality of rows HL to perform the sampling period.

Since the gate2 voltages S2 of different rows have different timings (e.g., difference of two horizontal periods (2H)), the sampling periods are performed during different sections in the subpixels SP of the pixel P of the odd column pair VLPo and the even column pair VLPe of each of the plurality of rows HL. As a result, a coupling of the data line DLL and DLR and the power line is reduced to a half, a variation (ripple) of a high level voltage Vdd of the power line due to the coupling is reduced, and a distortion of the data voltage Vdata due to the variation is reduced.

Further since the sampling period of the present row is driven using the gate2 voltage of the previous row or the next row without an additional signal, an additional gate driving unit for generating the additional signal is not required. As a result, the gate driving unit is simplified and a fabrication cost is reduced.

All of rows may perform the sampling period using the gate2 voltage of the next row in another aspect.

Figure 8:
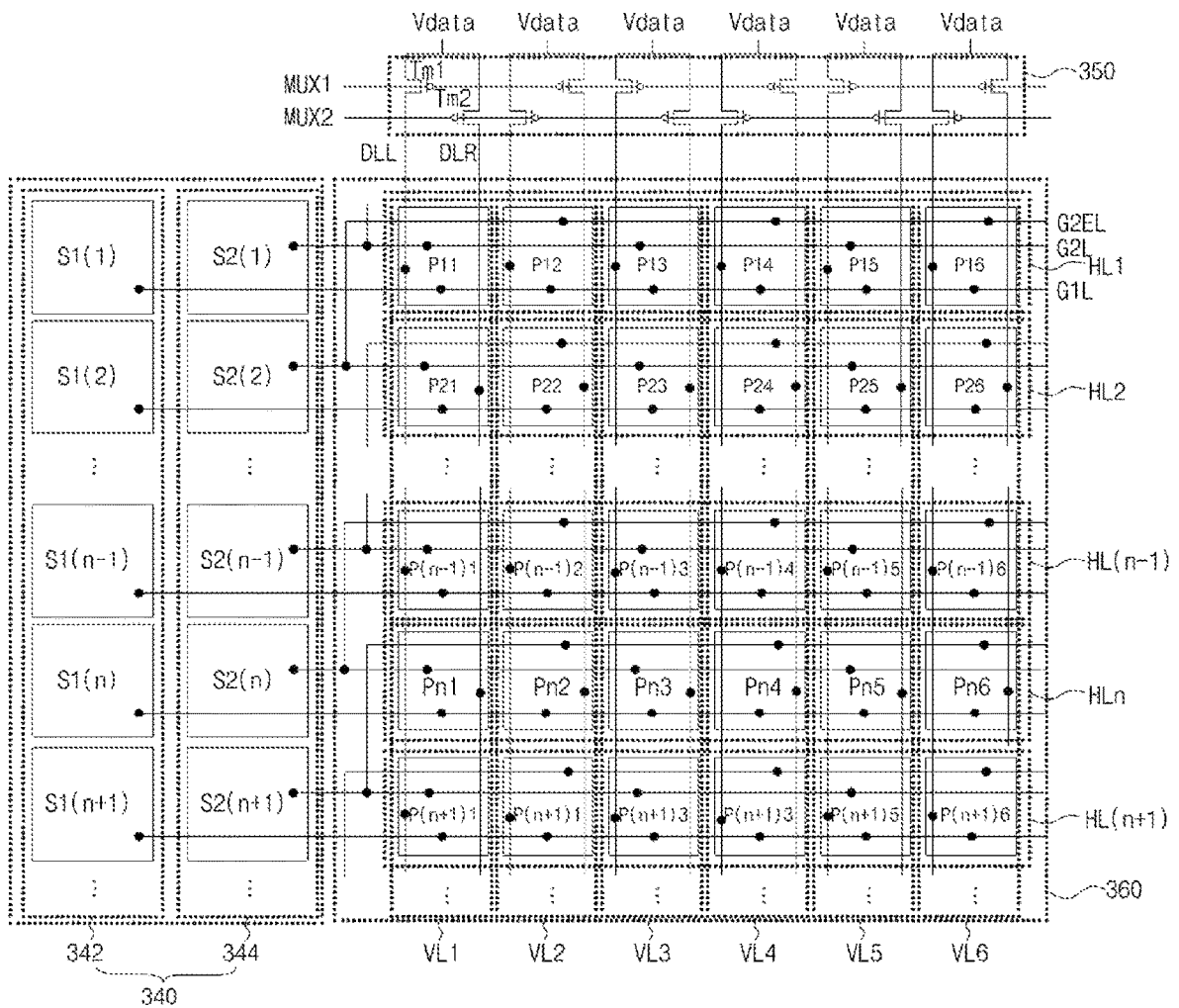
FIG. 8 is a view showing a connection of a pixel and a gate voltage of an organic light emitting diode display device according to a third aspect of the present disclosure.

FIG. 8 is a view showing a connection of a pixel and a gate voltage of an organic light emitting diode display device according to a third aspect of the present disclosure.

In FIG. 8, an organic light emitting diode (OLED) display device according to a third aspect of the present disclosure includes a gate driving unit 340, a mux unit 350 and a display panel 360.

The gate driving unit 340 includes a gate1 voltage generating part 342 generating a plurality of gate1 voltages S1 and a gate2 voltage generating part 344 generating a plurality of gate2 voltages S2. Each of the gate1 voltage generating part 342 and the gate2 voltage generating part 344 may include a shift register.

The mux unit 350 includes a first mux transistor Tm1 switched according to a first mux voltage MUX1 to transmit a data voltage Vdata of the data driving unit to one of a left data line DLL and a right data line DLR of the display panel 360 and a second mux transistor Tm2 switched according to a second mux voltage MUX2 to transmit the data voltage Vdata of the data driving unit to the other of the left data line DLL and the right data line DLR of the display panel 360. The first and second mux transistors Tm1 and Tm2 may be a positive type transistor.

The display panel 360 includes a plurality of pixels P. The plurality of pixels P may be disposed in a matrix of a plurality of rows HL parallel to a horizontal direction and a plurality of columns VL parallel to a vertical direction.

For example, the plurality of pixels P may include first-first to second-sixth pixels P11 to P26 and (n−1)th-first to nth-sixth pixels P(n−1)1 to Pn6, and the first-first to second-sixth pixels P11 to P26 and the (n−1)th-first to nth-sixth pixels P(n−1)1 to Pn6 may be classified into first, second, (n−1)th and nth rows HL1, HL2, HL(n−1) and HLn and first to sixth columns VL1 to VL6.

The left and right data lines DLL and DLR are disposed in left and right portions, respectively, of each subpixel SP, and each subpixel SP is connected to one of the left and right data lines DLL and DLR.

For example, the subpixel SP of odd rows HL1 and HL(n−1) may be connected to the gate line GL and the left data line DLL, and the subpixel SP of even rows HL2 and HLn may be connected to the gate line GL and the right data line DLR.

A gate1 line G1L transmitting the gate1 voltage S1 of a present row, a gate2 line G2L transmitting the gate2 voltage S2 of the present row and a gate2 extension line G2EL transmitting the gate2 voltage S2 of a next row are disposed in each of the plurality of rows HL. The gate1 line G1L is connected to the subpixel SP of the pixel P of each column VL of each row HL, the gate2 line G2L is connected to the subpixel SP of the pixel P of the odd columns VLo of each row HL, and the gate2 extension line G2EL is connected to the subpixel SP of the pixel P of the even columns VLe of each row HL.

For example, the gate1 line G1L transmitting the first gate1 voltage S1(1) of the present row, the gate2 line G2L transmitting the first gate2 voltage S2(1) of the present row and the gate2 extension line G2EL transmitting the second gate2 voltage S2(2) of the next row are disposed in the first row HL1, and the gate1 line G1L transmitting the second gate1 voltage S1(2) of the present row, the gate2 line G2L transmitting the second gate2 voltage S2(2) of the present row and the gate2 extension line G2EL transmitting the third gate2 voltage S2(3) of the next row are disposed in the second row HL2.

The gate1 line G1L transmitting the first gate1 voltage S1(1) of the present row is connected to the subpixels SP of the first-first to first-sixth pixels P11 to P16 of the first row HL1, the gate2 line G2L transmitting the first gate2 voltage S2(1) of the present row is connected to the subpixels SP of the first-first, first-third and first-fifth pixels P11, P13 and P15 of the first row HL1, and the gate2 extension line G2EL transmitting the second gate2 voltage S2(2) of the next row is connected to the subpixels SP of the first-second, first-fourth and first-sixth pixels P12, P14 and P16 of the first row HL1.

The gate1 line G1L transmitting the second gate1 voltage S1(2) of the present row is connected to the subpixels SP of the second-first to second-sixth pixels P21 to P26 of the second row HL2, the gate2 line G2L transmitting the second gate2 voltage S2(2) of the present row is connected to the subpixels SP of the second-first, second-third and second-fifth pixels P21, P23 and P25 of the second row HL2, and the gate2 extension line G2EL transmitting the third gate2 voltage S2(3) of the next row is connected to the subpixels SP of the second-second, second-fourth and second-sixth pixels P22, P24 and P26 of the second row HL2.

Similarly, the gate1 line G1L transmitting the (n−1)th gate1 voltage S1($n$−1) of the present row, the gate2 line G2L transmitting the (n−1)th gate2 voltage S2($n$−1) of the present row and the gate2 extension line G2EL transmitting the nth gate2 voltage S2($n$) of the next row are disposed in the (n−1)th row HL(n−1), the gate1 line G1L transmitting the nth gate1 voltage S1($n$) of the present row, the gate2 line G2L transmitting the nth gate2 voltage S2($n$) of the present row and the gate2 extension line G2EL transmitting the (n+1)th gate2 voltage S2($n$+1) of the next row are disposed in the nth row HLn, and the gate1 line G1L transmitting the (n+1)th gate1 voltage S1($n$+1) of the present row, the gate2 line G2L transmitting the (n+1)th gate2 voltage S2($n$+1) of the present row and the gate2 extension line G2EL transmitting the (n+2)th gate2 voltage S2($n$+2) of the next row are disposed in the (n+1)th row HL(n+1).

The gate1 line G1L transmitting the (n−1)th gate1 voltage S1($n$−1) of the present row is connected to the subpixels SP of the (n−1)th-first to (n−1)th-sixth pixels P(n−1)1 to P(n−1)6 of the (n−1)th row HL(n−1), the gate2 line G2L transmitting the (n−1)th gate2 voltage S2($n$−1) of the present row is connected to the subpixels SP of the (n−1)th-first, (n−1)th-third and (n−1)th-fifth pixels P(n−1)1, P(n−1)3 and P(n−1)5 of the (n−1)th row HL(n−1), and the gate2 extension line G2EL transmitting the nth gate2 voltage S2($n$) of the next row is connected to the subpixels SP of the (n−1)th-second, (n−1)th-fourth and (n−1)th-sixth pixels P(n−1)2, P(n−1)4 and P(n−1)6 of the (n−1)th row HL(n−1).

The gate1 line G1L transmitting the nth gate1 voltage S1($n$) of the present row is connected to the subpixels SP of the nth-first to nth-sixth pixels Pn1 to Pn6 of the nth row HLn, the gate2 line G2L transmitting the nth gate2 voltage S2($n$) of the present row is connected to the subpixels SP of the nth-first, nth-third and nth-fifth pixels Pn1, Pn3 and Pn5 of the nth row HLn, and the gate2 extension line G2EL transmitting the (n+1)th gate2 voltage S2($n$+1) of the next row is connected to the subpixels SP of the nth-second, nth-fourth and nth-sixth pixels Pn2, Pn4 and Pn6 of the nth row HLn.

The gate1 line G1L transmitting the (n+1)th gate1 voltage S1($n$+1) of the present row is connected to the subpixels SP of the (n+1)th-first to (n+1)th-sixth pixels P(n+1)1 to P(n+1)6 of the (n+1)th row HL(n+1), the gate2 line G2L transmitting the (n+1)th gate2 voltage S2($n$+1) of the present row is connected to the subpixels SP of the (n+1)th-first, (n+1)th-third and (n+1)th-fifth pixels P(n+1)1, P(n+1)3 and P(n+1)5 of the (n+1)th row HL(n+1), and the gate2 extension line G2EL transmitting the (n+2)th gate2 voltage S2($n$+2) of the next row is connected to the subpixels SP of the (n+1)th-second, (n+1)th-fourth and (n+1)th-sixth pixels P(n+1)2, P(n+1)4 and P(n+1)6 of the (n+1)th row HL(n+1).

As a result, the gate1 voltage S1 of the present row is supplied to the subpixel SP of the plurality of pixels P in each of the plurality of rows HL to perform an initialization period. Further, the gate2 voltage S2 of the present row is supplied to the subpixel SP of the pixel P in an odd column VLo of each of the plurality of rows HL to perform a sampling period, and the gate2 voltage S2 of the next row is supplied to the subpixel SP of the pixel P in an even column VLe of each of the plurality of rows HL to perform the sampling period.

Since the gate2 voltages S2 of different rows have different timings (e.g., difference of one horizontal period (1H)), the sampling periods are performed during different sections in the subpixels SP of the pixel P of the odd column VLo and the even column VLe of each of the plurality of rows HL. As a result, a coupling of the data line DLL and DLR and the power line is reduced to a half, a variation (ripple) of a high level voltage Vdd of the power line due to the coupling is reduced, and a distortion of the data voltage Vdata due to the variation is reduced.

Further, since the sampling period according to the gate2 voltage S2 of the next row is performed after an end of the initialization period of the present row, an operation stability of the initialization period is improved.

In addition, since the sampling period of the present row is driven using the gate2 voltage of the previous row or the next row without an additional signal, an additional gate driving unit is not required. As a result, the gate driving unit is simplified and a fabrication cost is reduced.

Consequently, in the OLED display device according to the present disclosure, since the plurality of pixel of one row have different sampling periods, the number of the pixels corresponding to the floated data line is reduced. As result, the distortion of the data voltage due to the variation (ripple) of the high level voltage is reduced, and the crosstalk is minimized.

Further, since the gate2 line and the gate2 extension line are disposed in one row and two gate2 voltages are alternately supplied to the plurality of pixels of one row, the gate diving unit is simplified and the number of the columns of the pixels corresponding to the floated data line is reduced. As result, the distortion of the data voltage due to the variation (ripple) of the high level voltage is reduced, and the crosstalk is minimized.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. An organic light emitting diode display device, comprising:

a plurality of pixels arranged in a matrix of a plurality of rows and a plurality of columns;

a gate1 line connected to and supplying a gate1 voltage to the plurality of pixels of each of the plurality of rows;

a gate2 line connected to and supplying a gate2 voltage of a present row to the plurality of pixels of a part of the plurality of columns;

a gate2 extension line connected to and supplying the gate2 voltage of an adjacent row to the plurality of pixels of another part of the plurality of columns; and left and right data lines disposed in left and right portions of the plurality of pixels of each of the plurality of columns, wherein the plurality of rows include (n−1)th and nth rows, wherein the gate2 line of the (n−1)th row supplies the gate2 voltage to a part of the plurality of pixels of the (n−1)th row, and the gate2 extension line of the (n−1)th row is connected to the gate2 line of the nth row and supplies the gate2 voltage to another part of the plurality of pixels of the (n−1)th row, and wherein the gate2 line of the nth row supplies the gate2 voltage to a part of the plurality of pixels of the nth row, and the gate2 extension line of the nth row is connected to the gate2 line of the (n−1)th row and supplies the gate2 voltage to another part of the plurality of pixels of the nth row.

2. The display device of claim 1, wherein the gate2 line is connected to the plurality of pixels of odd columns of the plurality of columns, and wherein the gate2 extension line is connected to the plurality of pixels of even columns of the plurality of columns.

3. The display device of claim 1, wherein the gate2 line is connected to the plurality of pixels of odd column pairs of the plurality of columns, and wherein the gate2 extension line is connected to the plurality of pixels of even column pairs of the plurality of columns.

4. The display device of claim 1, wherein the left data line is connected to the plurality of pixels of odd rows of the plurality of rows, and wherein the right data line is connected to the plurality of pixels of even rows of the plurality of rows.

5. The display device of claim 4, further comprising a mux unit connected to the left and right data lines, wherein the mux unit includes a first mux transistor connected to the left data line of odd columns of the plurality of columns and the right data line of even columns of the plurality of columns and a second mux transistor connected to the right data line of the odd columns of the plurality of columns and the left data line of the even columns of the plurality of columns.

6. The display device of claim 1, wherein each of the plurality of pixels has a subpixel that includes a driving transistor, first to ninth transistors, a storage capacitor and a light emitting diode, wherein the first, second, sixth and eighth transistors are switched according to the gate2 voltage, and the first transistor is connected between a gate electrode and a drain electrode of the driving transistor, wherein the third, fourth and seventh transistors are switched according to an emission voltage, and wherein the fifth and ninth transistors are switched according to the gate1 voltage.

7. An organic light emitting diode display device, comprising:

a plurality of pixels arranged in a matrix of a plurality of rows and a plurality of columns;

a gate1 line connected to and supplying a gate1 voltage to the plurality of pixels of each of the plurality of rows;

a gate2 line connected to and supplying a gate2 voltage of a present row to the plurality of pixels of a part of the plurality of columns;

a gate2 extension line connected to and supplying the gate2 voltage of an adjacent row to the plurality of pixels of another part of the plurality of columns; and left and right data lines disposed in left and right portions of the plurality of pixels of each of the plurality of columns, wherein the plurality of rows include (n−1)th, nth and (n+1)th rows, wherein the gate2 line of the (n−1)th row supplies the gate2 voltage to a part of the plurality of pixels of the (n−1)th row, and the gate2 extension line of the (n−1)th row is connected to the gate2 line of the nth row and supplies the gate2 voltage to another part of the plurality of pixels of the (n−1)th row, and wherein the gate2 line of the nth row supplies the gate2 voltage to a part of the plurality of pixels of the nth row, and the gate2 extension line of the nth row is connected to the gate2 line of the (n+1)th row and supplies the gate2 voltage to another of the plurality of pixels of the nth row.

8. A method of driving an organic light emitting diode display device, comprising:

initializing a plurality of pixels of a plurality of rows according to a gate1 voltage;

sampling the plurality of pixels of a part of a plurality of columns according to a gate2 voltage of a present row;

sampling the plurality of pixels of another part of the plurality of columns according to the gate2 voltage of an adjacent row; and emitting the plurality of pixels according to an emission voltage, wherein the plurality of rows include (n−1)th and nth rows, wherein a gate2 line and a gate2 extension line are disposed to correspond to each of the (n−1)th and nth rows, wherein the gate2 line of the (n−1)th row supplies the gate2 voltage to a part of the plurality of pixels of the (n−1)th row, and the gate2 extension line of the (n−1)th row is connected to the gate2 line of the nth row and supplies the gate2 voltage to another part of the plurality of pixels of the (n−1)th row, and wherein the gate2 line of the nth row supplies the gate2 voltage to a part of the plurality of pixels of the nth row, and the gate2 extension line of the nth row is connected to the gate2 line of the (n−1)th row and supplies the gate2 voltage to another part of the plurality of pixels of the nth row.

9. The method of claim 8, wherein the gate2 voltage of the present row is supplied to the plurality of pixels of odd columns of the plurality of columns, and wherein the gate2 voltage of the adjacent row is supplied to the plurality of pixels of even columns of the plurality of columns.

10. The method of claim 8, wherein the gate2 voltage of the present row is supplied to the plurality of pixels of odd column pairs of the plurality of columns, and wherein the gate2 voltage of the adjacent row is supplied to the plurality of pixels of even column pairs of the plurality of columns.

* * * * *